US011133812B1

(12) United States Patent
Lebedev et al.

(10) Patent No.: US 11,133,812 B1
(45) Date of Patent: Sep. 28, 2021

(54) ASYNCHRONOUS SAR ADC USING TWO-STAGE COMPARATOR HAVING SEPARATE RESETS

(71) Applicants: Semyon Lebedev, Ottawa (CA); Babak Zamanlooy, Ottawa (CA); Marc-Andre Lacroix, Carp (CA)

(72) Inventors: Semyon Lebedev, Ottawa (CA); Babak Zamanlooy, Ottawa (CA); Marc-Andre Lacroix, Carp (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/080,263

(22) Filed: Oct. 26, 2020

(51) Int. Cl.
*H03M 1/06* (2006.01)
*H03M 1/46* (2006.01)
*H03M 1/40* (2006.01)
*H03M 1/38* (2006.01)
*H03M 1/12* (2006.01)

(52) U.S. Cl.
CPC ........... *H03M 1/0607* (2013.01); *H03M 1/38* (2013.01); *H03M 1/40* (2013.01); *H03M 1/462* (2013.01); *H03M 1/125* (2013.01); *H03M 1/46* (2013.01)

(58) Field of Classification Search
CPC .... H03M 1/0607; H03M 1/125; H03M 1/462; H03M 1/38; H03M 1/40; H03M 1/46
USPC .................................. 341/155, 161, 163, 172
See application file for complete search history.

(56) References Cited

U.S. PATENT DOCUMENTS

| 8,344,925 B1 * | 1/2013 | Evans | H03M 1/462 |
| | | | 341/155 |
| 8,786,483 B1 * | 7/2014 | Thompson | H03M 1/0836 |
| | | | 341/161 |

OTHER PUBLICATIONS

Kull, L. et al, "A 3.1 mW 8b 1.2 GS/s Single-Channel Asynchronous SAR ADC With Alternate Comparators for Enhanced Speed in 32 nm Digital SOI CMOS", IEEE Journal of Solid-State Circuits, vol. 48, No. 12, pp. 3049-3058, Dec. 2013.
Verbruggen, B., et al., "A 1.7 mW 11b 250 MS/s 2-Times Interleaved Fully Dynamic Pipelined SAR ADC in 40 nm Digital CMOS", IEEE Journal of Solid-State Circuits, vol. 47, No. 12, pp. 2880-2887, Dec. 2012.

* cited by examiner

*Primary Examiner* — Khai M Nguyen

(57) ABSTRACT

Systems and circuits for an asynchronous SAR ADC are described. The SAR ADC includes a two-stage comparator with a preamplifier first stage and a latch second stage. The preamplifier first stage is activated by an active pulse of a first clock signal and the latch second stage is activated by an active pulse of a second clock signal. The Done signal from a done detector is fed back as the active pulse of the first clock signal. The leading edge of the active pulse of the second clock signal is driven by the leading edge of the active pulse of the first clock signal via an RS latch. The Done signal is further fed back through the RS latch to drive a trailing edge of the active pulse of the second clock signal.

16 Claims, 8 Drawing Sheets

ASYNCHRONOUS SAR ADC USING TWO-STAGE COMPARATOR HAVING SEPARATE RESETS

FIELD

The present disclosure is related to asynchronous successive approximation register (SAR) analog-to-digital converters (ADCs), including asynchronous SAR ADC circuits using two-stage comparators.

BACKGROUND

The asynchronous successive approximation register (SAR) analog-to-digital converter (ADC) is a mixed signal design with an external sampling clock and an internally generated asynchronous clock for producing successive digital N-bit outputs. In order to be used for high speed signals, it is important for the SAR ADC to have a fast conversion time. Further, it is generally desirable to reduce power consumption and occupied chip area of the SAR ADC.

Another important consideration when designing a circuit for the SAR ADC is that comparator noise is a main contributor to degradation of the signal-to-noise and distortion ratio (SNDR). Common conventional circuit designs address this consideration by using a two-stage comparator having a first-stage preamplifier and a second-stage latch. Modern SAR designs typically use dynamic comparators controlled by a clock which brings the comparator into active or reset operation phases. In such conventional circuits, the comparator reset time is typically the main limitation for speed of each successive bit conversion of the overall SAR ADC circuit.

Accordingly, it would be useful to provide a design for the asynchronous SAR ADC that can achieve a faster bit conversion time.

SUMMARY

The present disclosure describes an asynchronous SAR ADC with a two-stage comparator, in which reset phases of the two comparator stages are separated. Bypass switches are added to the second stage of the comparator to enable the second stage to be decoupled from the first stage when the first stage enters the reset phase. This design enables the first stage of the comparator to be reset earlier, rather than having to wait for reset of the second stage. This in turn results in faster conversion time of the SAR ADC. In addition, a delayed second stage Done pulse is used as a next bit first stage clock pulse, thus avoiding the need for added hardware to generate the first stage clock.

The disclosed asynchronous SAR ADC circuit design may be implemented without significant increase to the circuit complexity or circuit size. The disclosed circuit design also enables power savings, compared to conventional asynchronous SAR ADC circuits.

In some example aspects, the present disclosure describes an asynchronous successive approximation register (SAR) analog-to-digital converter (ADC). The asynchronous SAR ADC includes: a register storing bit values of a digital output signal converted from an analog input signal; a digital to analog converter (DAC) receiving a signal representing a bit value stored in the register, and generating an analog DAC signal based on the bit value; a two-stage comparator receiving the analog DAC signal and the analog input signal, and generating a comparator output signal representing a comparison decision between the analog DAC signal and the analog input signal, the comparison decision indicating a value of a next bit to be stored in the register, the two-stage comparator having a preamplifier first stage activated by an active pulse of a first clock signal and a latch second stage activated by an active pulse of a second clock signal; a done detector detecting the comparator output signal, and generating a Done signal indicating completion of the comparison decision; wherein the Done signal from the done detector is fed back as the active pulse of the first clock signal; wherein a leading edge of the active pulse of the second clock signal is driven by a leading edge of the active pulse of the first clock signal via an RS latch; and wherein the Done signal from the done detector is further fed back through the RS latch to drive a trailing edge of the active pulse of the second clock signal.

In any of the above examples, a trailing edge of the active pulse of the first clock signal may cause the preamplifier first stage to enter a reset phase prior to completion of the comparison decision, and the leading edge of the active pulse of the first clock signal may cause the preamplifier first stage to enter an active phase when the Done signal indicates completion of the comparison decision.

In any of the above examples, the trailing edge of the active pulse of the second clock signal may cause the latch second stage to enter a reset phase when the Done signal indicates completion of the comparison decision.

In any of the above examples, the analog DAC signal may converge to a settled value after a DAC convergence time, and the first clock signal may be synchronized with the DAC convergence time to cause the preamplifier first stage to enter the active phase when the analog DAC signal has converged to the settled value.

In any of the above examples, the asynchronous SAR ADC may include a DAC convergence delay unit in a feedback path from the done detector to the preamplifier first stage, the DAC convergence delay unit applying a preset time delay to synchronize the first clock signal with the DAC convergence time.

In any of the above examples, the latch second stage may include two bypass switches controlled by the second clock signal, and the second clock signal may control the two bypass switches to selectively decouple the latch second stage from the preamplifier first stage.

In any of the above examples, the first clock signal may cause the preamplifier first stage to enter a reset phase prior to completion of the comparison decision, and the second clock signal may control the two bypass switches to decouple the latch second stage from the preamplifier first stage when the preamplifier first stage enters the reset phase.

In any of the above examples, the active pulse of the first clock signal may have an active pulse width resulting from internal circuit delay of activation of the done detector.

In some example aspects, the present disclosure describes a system for conversion of an analog input signal to a digital output signal. The system includes: two or more asynchronous successive approximation register (SAR) analog-to-digital converters (ADCs), each asynchronous SAR ADC receiving the analog input signal and performing analog to digital conversion to output a respective sub-channel digital output signal; and a digital multiplexer receiving the respective sub-channel digital output signals from each respective SAR ADC, and multiplexing the respective sub-channel digital output signals to generate a final digital output signal. Each asynchronous SAR ADC includes: a register storing bit values of the respective sub-channel digital output signal converted from the analog input signal; a digital to analog converter (DAC) receiving a signal representing a bit value stored in the register, and generating an analog DAC signal based on the bit value; a two-stage comparator receiving the analog DAC signal and the analog input signal, and generating a comparator output signal representing a comparison decision between the analog DAC signal and the analog input signal, the comparison decision indicating a value of a next bit to be stored in the register, the two-stage comparator having a preamplifier first stage activated by an active pulse of a first clock signal and a latch second stage activated by an active pulse of a second clock signal; a done detector detecting the comparator output signal, and generating a Done signal indicating completion of the comparison decision; wherein the Done signal from the done detector is fed back as the active pulse of the first clock signal; wherein a leading edge of the active pulse of the second clock signal is driven by a leading edge of the active pulse of the first clock signal via an RS latch; and wherein the Done signal from the done detector is further fed back through the RS latch to drive a trailing edge of the active pulse of the second clock signal.

The system may include the asynchronous SAR ADC as described in any of the above examples.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
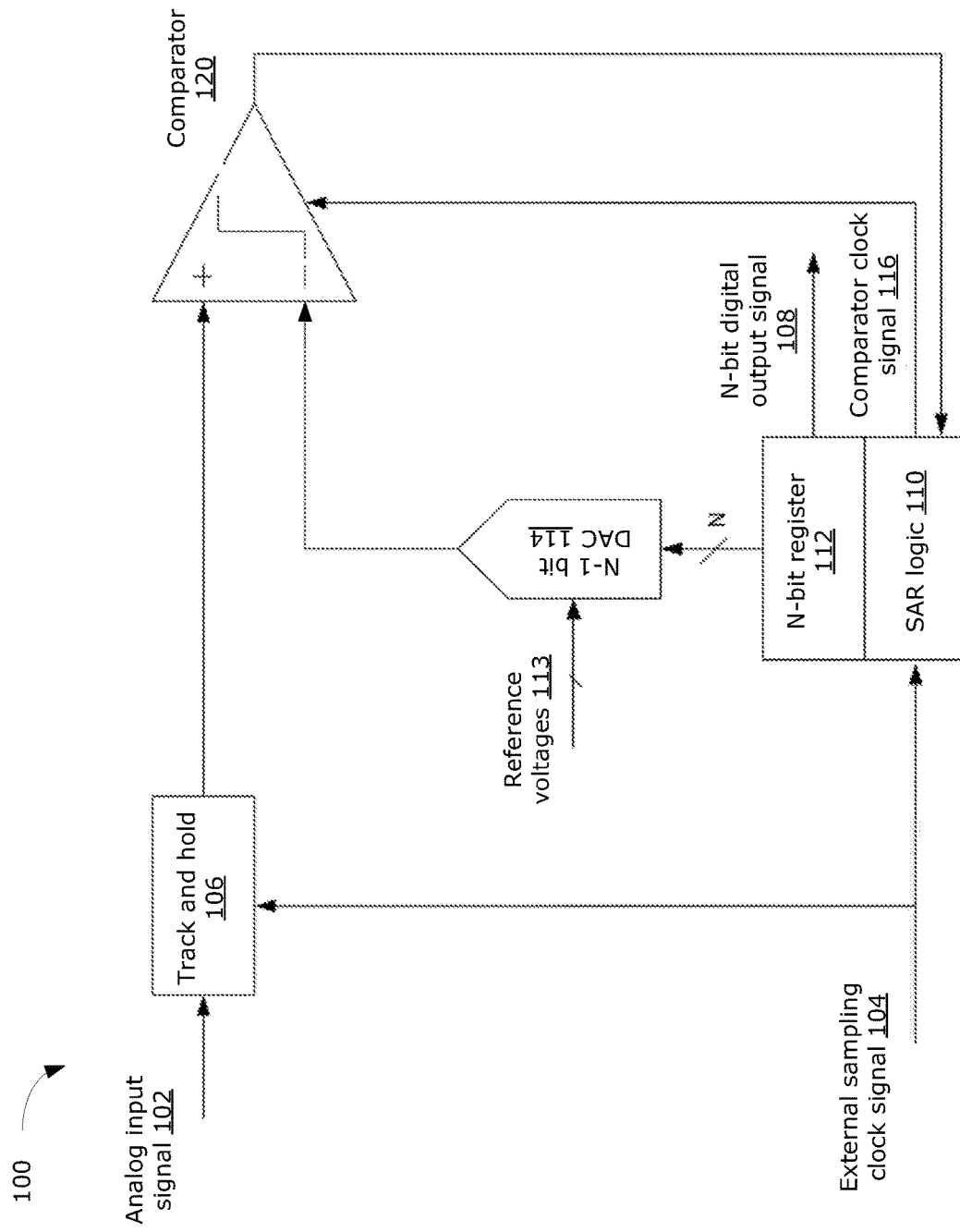
FIG. 1 is a schematic diagram illustrating simplified operation of an example asynchronous SAR ADC.

FIG. 1 is a schematic diagram that illustrates general, simplified operation of an example asynchronous successive approximation register (SAR) analog-to-digital converter (ADC) 100. The SAR ADC 100 receives as input an analog input signal 102 that is to be converted to an N-bit digital signal, and an external sampling clock signal 104. The SAR ADC 100 includes a track and hold circuit 106, a comparator 120, a SAR logic circuit 110, an N-bit register 112, and an N−1 bit digital-to-analog converter (DAC) 114. The external sampling clock signal 104 is received by the SAR logic circuit 110 as a trigger signal to trigger the start of a conversion cycle. After receiving the trigger, the SAR logic circuit 110 generates an internal asynchronous comparator clock signal 116. The comparator clock signal 116 is provided as input to the comparator 120.

At the start of a conversion cycle, the N-bit register 112 activates a comparator 108 to receive the most significant bit (MSB) digital value. The N-bit register 112 triggers the next bit cycle by setting MSB control of the N−1 DAC 114 which in turn activates the comparator 108 to receive the next bit digital value, and so on until the last digital bit (also referred to as the least significant bit (LSB)) is received. The N−1 bit DAC 114 may be a capacitive DAC (CDAC). For each subsequent bit, the N−1 bit DAC 114 uses the binary value from the N-bit register 112 and converts this binary value to an analog signal (using the reference voltages 113) and feeds the converted analog signal to the comparator 120. The analog input signal 102 is captured by the track and hold circuit 106, which is controlled by the external sampling clock signal 104 and provides the voltage to the comparator 120. This voltage remains constant during the SAR conversion cycle. The comparator 120 compares the voltage of the analog input signal 102 with the signal provided by the N−1 bit DAC 114. Based on the comparison, the comparator 120 outputs a high or low output to indicate the determined binary value of the bit, which is stored in the N-bit register 112. The comparator 120 is reset and the process repeats with the next significant bit, until the binary values of all bits (successively from the MSB to the least significant bit (LSB)) have been determined and an N-bit digital output signal 108 can be outputted by the N-bit register 112.

A full conversion cycle refers to conversion of the analog input signal 102 to all N bits of digital data. Each determination of a bit value is referred to as a sub-cycle. The conversion time of the asynchronous SAR ADC 100 is the total time for completing all N sub-cycles, for an N-bit digital output. The time for completing a sub-cycle is dependent on the convergence time of the N−1 bit DAC 114, and the comparison (i.e., active) and reset times of the comparator 120, in addition to any overhead time (e.g., from the SAR logic circuit 110).

The start of each cycle is triggered by the external clock signal 104, which is has a constant period, however each sub-cycle is performed asynchronously. In asynchronous timing, the clock is active only when it is required. Often, a combination of clocking sub-signals and inherent hand-over delays from one circuit to another is used for clocking. The asynchronous design allows the SAR ADC 100 to use the available conversion time more effectively in the presence of meta-stability problems. A one-comparator design, as shown in FIG. 1, has a relatively low input capacitive load compared to a multi-comparator implementation, and has only a single offset cancellation mechanism.

For conversion of high speed signals, SAR ADCs with high sampling speeds (e.g., on the order of tens to hundreds of GHz) are required. SAR ADCs with interleaved sub-channels are used to achieve such high sampling speeds. In such a design, multiple SAR ADCs are used in parallel, each SAR ADC being responsible for conversion of N-bits per sub-channel. Thus, interleaved sub-channels enable significantly faster overall conversion time, without having to drastically speed up the conversion speed of the sub-channels. This makes the implementable of SAR ADCs with sampling speed on the order of hundreds of GHz possible, using current circuit technologies.

When designing a SAR ADC, there are several factors that are typically taken into consideration. One consideration is the number of bits for conversion. Many current receiver systems use 32 to 64 sub-channels. By interleaving more sub-channels of medium resolution (e.g., 6 to 8 bit resolution per sub-channel), overall sampling speeds of 32 GHZ, 64 GHz, 128 GHz or faster can be achieved. In serializer/deserializer (SERDES) link implementation, the number of bits required for a SAR ADC is typically dependent on the required signal-to-noise and distortion ratio (SNDR) of the receiver system. Typically, current state of the art systems with ADC-digital signal processor (DSP) receivers designed for pulse-amplitude modulation 4-level (PAM4) signaling use at least 7-bit resolution.

Another consideration is the conversion speed and sub-channels number required. Each SAR ADC should process the required number of bits (e.g., 7 bits) within the assigned conversion time. As mentioned above, the conversion time of a SAR ADC is limited by the design and characteristics of the SAR ADC circuit. Based on the known achievable per sub-channel conversion speed, it is possible to calculate how many interleaved sub-channels are required to achieve a target sampling rate. For example, to achieve a target 64 GHz sampling rate using interleaved SAR ADCs with individual sub-channel conversion speed of 1 GHz, 64 sub-channels are required. If the sub-channel conversion speed can be increased to 1.33 GHz, only 48 sub-channels will be required. Having a greater number of sub-channels results in greater power consumption and greater occupied chip area. Thus, it is generally desirable to have higher conversion speeds to decrease the number of required sub-channels, and at the same time achieving other performance targets.

As mentioned above, the power consumption of each sub-channel is also a factor to take into consideration when designing an interleaved SAR ADC. Many current SAR ADC designs use 0.7V to 0.9V voltage supply levels. Operation at the lower range of supply level enables power savings that is approximately proportional to the square root of the supply value.

Another factor to take into consideration is the occupied chip area. Generally, it is desirable to occupy a smaller chip area, provided other performance targets can be achieved.

Figure 2:
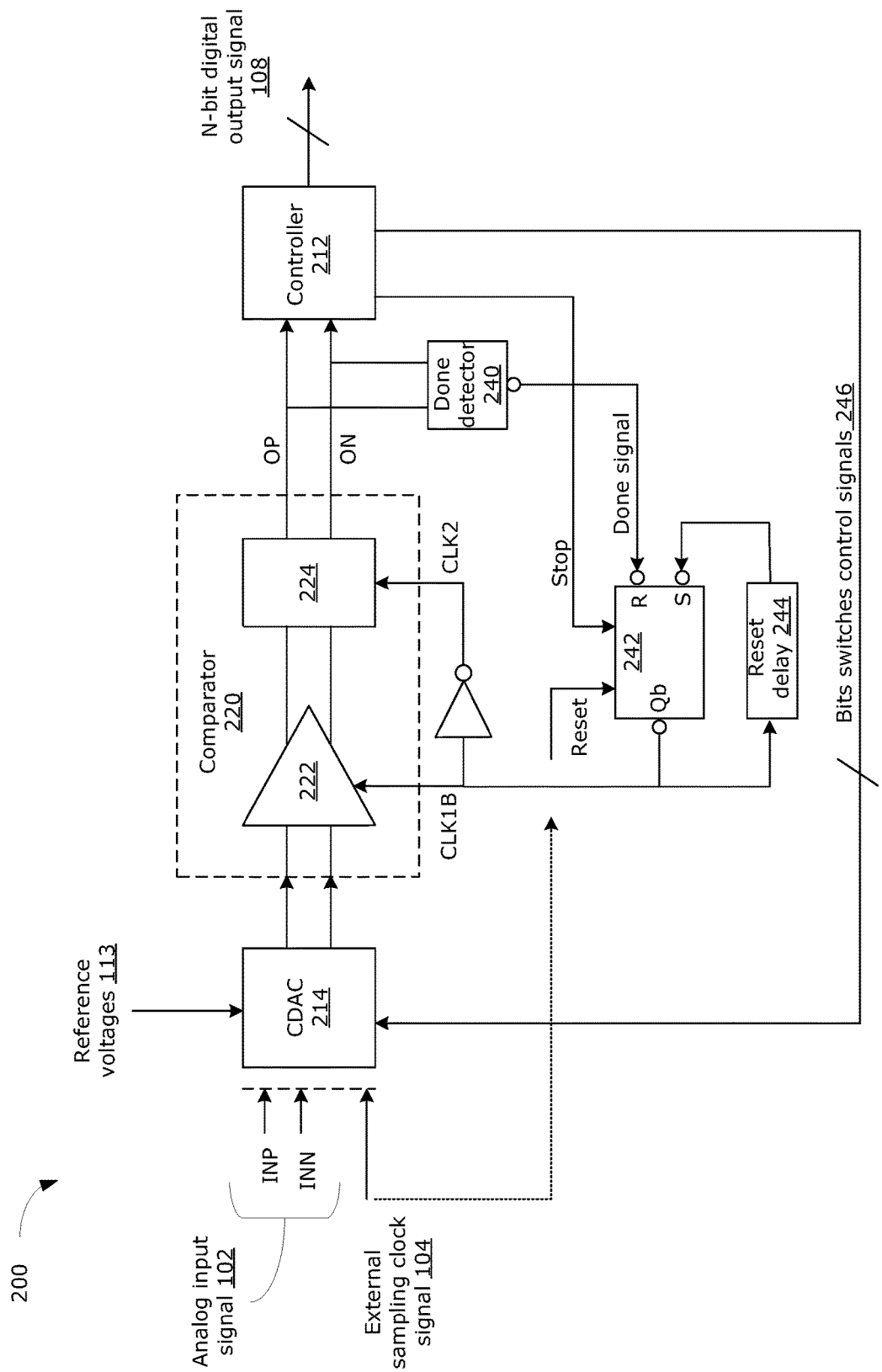
FIG. 2 is a schematic diagram of an example conventional circuit for an asynchronous SAR ADC.
Figure 3:
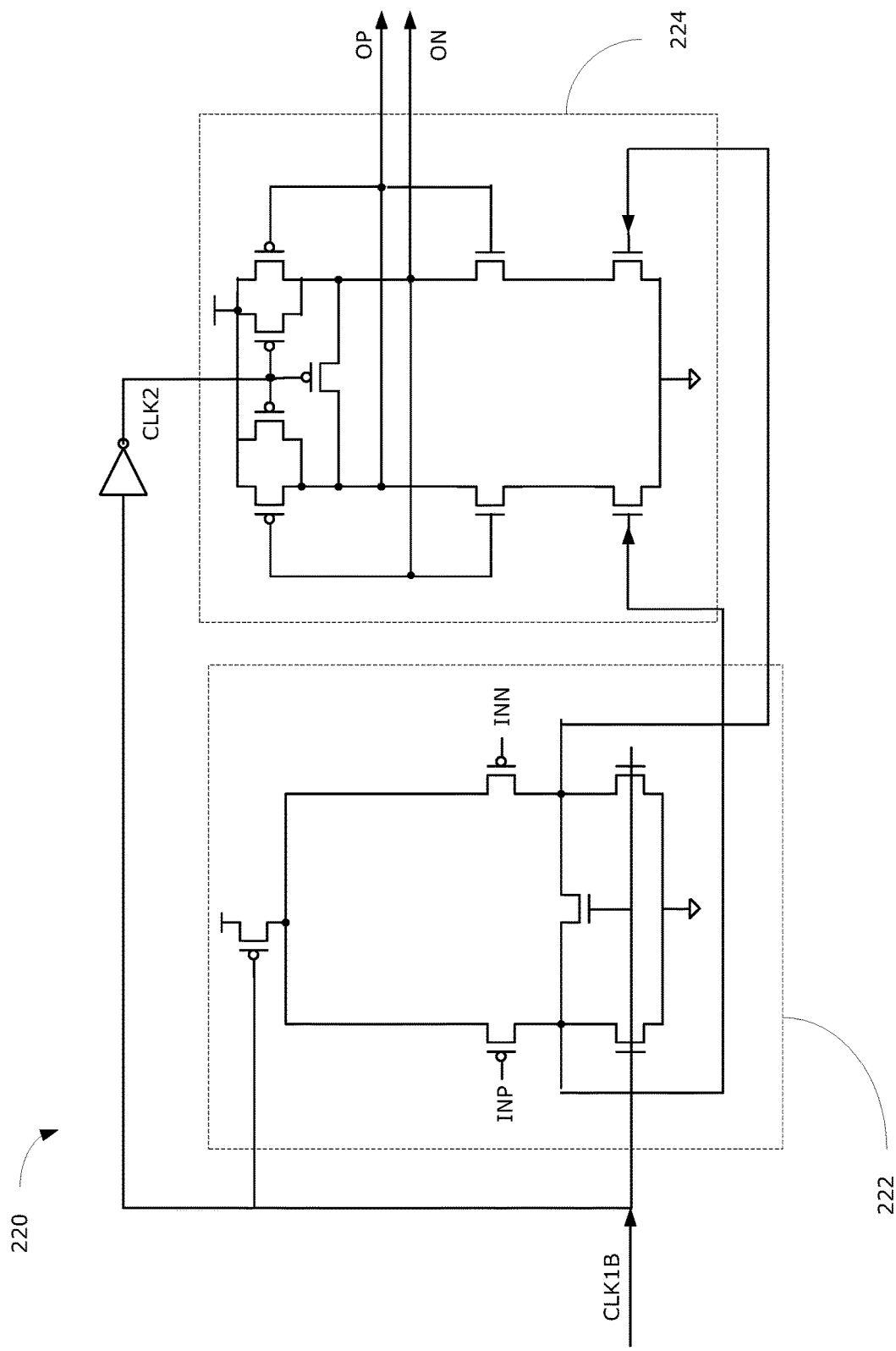
FIG. 3 is a schematic diagram of an example conventional two-stage comparator, which may be used in the circuit of FIG. 2.

FIGS. 2 and 3 illustrate an example circuit for a conventional asynchronous SAR ADC 200, and will be described together. FIG. 2 shows a differential implementation of a conventional SAR ADC 200, however it should be understood that the circuit for a single-ended implementation may be similar. FIG. 3 shows an example circuit for the two-stage comparator 220 in the SAR ADC 200. For simplicity, some details of the conventional SAR ADC 200 have been omitted, such as the track and hold circuit.

The conventional SAR ADC 200 in this example receives as input the analog input signal 102 (consisting of the signal pair INP and INN), and the external sampling clock signal 104, and outputs the N-bit digital output signal 108. The conventional SAR ADC 200 includes a CDAC 214 (as the N−1 bit DAC), and a controller 212 which stores digital output bits (e.g., using bit latches), outputs CDAC 214 bits switches control signals 246 and counts converted bits number. The conventional SAR ADC 200 in this example uses a two-stage comparator, having a first stage 222 and a second stage 224.

As mentioned previously, comparator noise is a major contributor affecting the SNDR of the receiver system. The two-stage design of the comparator 220 aims to increase the total comparator gain, to help reduce the comparator noise. The comparator 220 includes a preamplifier first stage 222, and a latch second stage 224. Since the comparator 220 typically has random offset, offset compensation may be included in the circuit. The first stage 222 may include current sources or other types of offset compensation component (not shown) to compensate for comparator offset. It should be noted that offset compensation can be done in any other suitable way. In some examples, additional reset devices may be included.

Output from the comparator 220 is detected by a done detector 240 that detects when the comparator has settled on a decision (e.g., the output from the comparator 220 is steady), and the done detector 240 generates a Done signal (also referred to as a DONEb signal) accordingly. The done signal indicates the completion of one bit sub-cycle. The done detector 240 may be implemented using any suitable circuitry.

The Done signal is provided to the R input of an RS latch 242. When the done signal indicates completion of a comparison decision at the comparator 220 (e.g., when the Done signal is set low), this causes the RS latch to generate a Qb (or $\overline{Q}$) output that is high. The Qb output of the RS latch 242 is provided as a first asynchronous clock signal (denoted as CLK1B) which when high resets the first stage 222 of the comparator 220, and is inverted to be a second clock signal (denoted as CLK2) which when low resets the second stage 224 of the comparator 220. The Qb output is also fed back to the S input, via a reset delay unit 244, to return the Qb output to low (and hence end the reset phase of the comparator stages 222, 224, returning the comparator stages 222, 224 to the active phase). The reset delay unit 244 applies a preset time delay, to ensure that the first and second clock signals provided to the comparator 220 have sufficient pulse width to fully reset the first and second stages 222, 224 of the comparator 220. The RS latch 242 receives an external reset signal (e.g., from the external sampling clock 104) to reset at the start of each conversion cycle. The RS latch 242 is also connected to receive a Stop signal from the controller 212. The Stop signal is activated (e.g., set to high) when the number of stored bits counted by the controller 212 reaches the expected N number of bits. The Stop signal indicates the end of the current conversion cycle and stops the asynchronous signals (e.g., the asynchronous first and second clock signals) until the external reset signal is acquired from the next external sampling clock 104. This helps to ensure there are no extra unnecessary asynchronous clock pulses.

The effect of feeding the Done signal to the RS latch 242, to generate the Qb output as the first and second clock signals is that both the first and second stages 222, 224 of the two-stage comparator 220 are reset effectively at the same time (as will be seen in the timing diagram of FIG. 4, discussed below).

There are two asynchronous processes that must be completed before the comparator 200 can be ready for the next sub-cycle. These two processes are full reset of both stages 222, 224 of the comparator 220, and full convergence of the CDAC 214 to the latest value.

In a conventional state of the art SAR ADC 200, the reset time required by the comparator 220 (including time delay associated with the comparator 220 entering the reset phase, plus the time duration of the reset phase) is typically longer than the settling time for the CDAC 214. Accordingly, the non-active part of the conversion time for one sub-cycle is typically determined by the reset time required by the comparator 220. Thus, the overall speed of the conventional SAR ADC 200 may be considered to be comparator reset driven.

Figure 4:
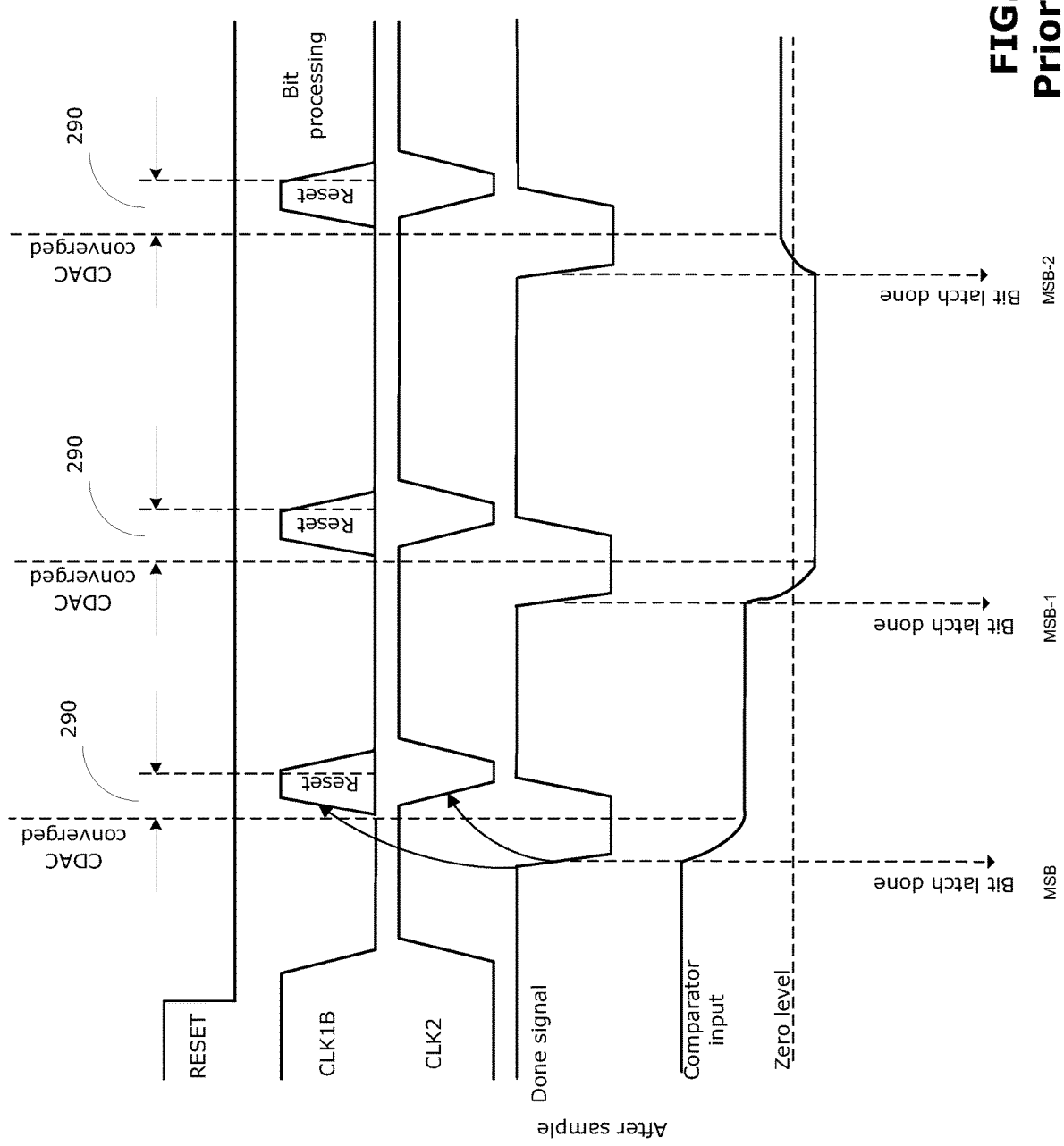
FIG. 4 is an example timing diagram illustrating conversion time of the conventional asynchronous SAR ADC of FIG. 2.

FIG. 4 is a timing diagram illustrating how comparator reset time affects the conversion time of the conventional SAR ADC 200 (for simplicity, the timing diagram illustrates the timing for conversion of only the first three bits, specifically the MSB, followed by MSB-1, then MSB-2).

The conversion cycle begins after the end of an external RESET signal (e.g., from the external sampling clock signal 104) which effectively resets the comparator 220 and all associated logic to be ready for the coming conversion cycle. After the end of this RESET signal the first stage clock signal CLK1B is set low and the second stage clock signal CLK2 is set high, enabling the comparator 220. After an amount of time required to perform the comparison and convergence of the second stage latch (indicated in FIG. 4 as the bit latch done time), the comparator 220 has completed a comparison decision on a given bit, and the done detector 240 detects the decision and generates the Done signal (in this example, the Done signal is set to low to indicate a completed decision). It may be noted in FIG. 4 that the time for processing each bit by the comparator 220 differs for each bit depending on the difference between the two signals to be compared on each bit sub-cycle.

After the bit latch is done, depending on the received bit value bit switches controls 246 are updated and fed to the CDAC 214 and the CDAC 214 takes a certain amount of time to converge to a settled value (the end of this process is indicated in FIG. 4 as the CDAC converged line). Meanwhile, the Done signal drives (via the RS latch 242) the first and second clock signals CLK1B and CLK2, as indicated by the curved arrows. The complementary first clock signal CLK1B (high) and second clock signal CLK2 (low), move (almost simultaneously) both stages of the comparator 220 into the respective reset phase. The pulse width for each of the clock signals is wide enough to ensure respective reset phases have enough time for the full reset of the corresponding stage in the comparator 220. As shown in FIG. 4 there is a period of time 290 between the time when the CDAC 214 has converged (and is ready for the next bit) and when the comparator 220 full reset is done, and this time 290 is effectively wasted. Because this time 290 is present for each sub-cycle, the total lost time 290 is cumulative and may be significant over multiple bits. In a typical conventional two-stage comparator 220, this lost time 290 may be approximately 20 ps per sub-cycle, which can add up to over 120 ps for a full conversion (e.g., for a 7-bit conversion).

In the conventional two-stage comparator 220, the first stage 222 may require relatively short time, compared to the second stage 224, to produce an amplified signal difference at its output. However, the first stage 222 must wait for completion of processing by the second stage 224 so that both stages 222, 224 are reset together. The first stage 222 may be sitting idle for a significant period of time (e.g., on the order of tens of picoseconds).

Some attempts have been made to address this issue of lost time. There are known circuit designs that use multiple comparators, each one dedicated for processing one bit only and passing control from one comparator to another. In this design, each comparator is in the reset phase until the time for processing its respective bit. Another known circuit design is to use two comparators in a "ping-pong" configuration, in which one comparator is processing data, while the other comparator is being reset. However, these existing designs typically require more chip area for the added comparators, which is a drawback. Further, every added comparator introduces additional input capacitance and requires its own separate offset calibration, which are additional drawbacks.

In examples disclosed herein, an asynchronous SAR ADC design is described that enables the first stage of a two-stage comparator to be reset separately from the reset of the second stage. By enabling separate resets for the two comparator stages, the first stage is able to start processing the next bit from the CDAC earlier without waiting to be reset together with the second stage. When next bit conversion sub-cycle starts, it is not required to wait for the first stage to be reset. The sub-cycle can begin immediately after the CDAC output has sufficiently converged to the new value. In addition, a delayed signal which indicates the end of a bit conversion sub-cycle (i.e., the Done signal) may be used for creation of the next bit active pulse for the first stage, which reduces the hardware required for controlling comparator timing. In particular, the disclosed circuit design may be implemented without requiring significant added complexity to conventional SAR ADC circuits (e.g., without requiring additional comparators).

Figure 5:
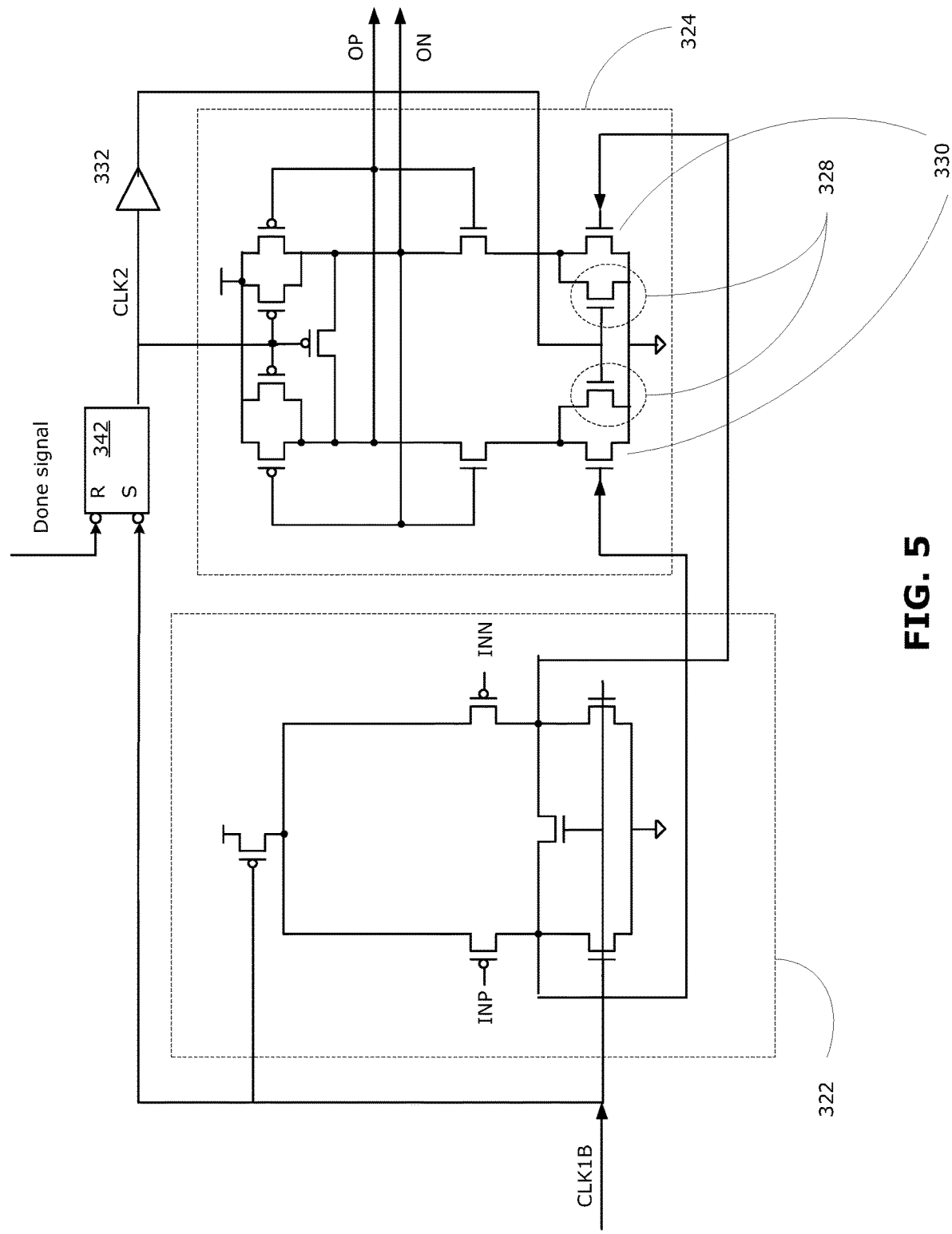
FIG. 5 is a schematic diagram of an example two-stage comparator with separate resets, in accordance with the present disclosure.
Figure 6:
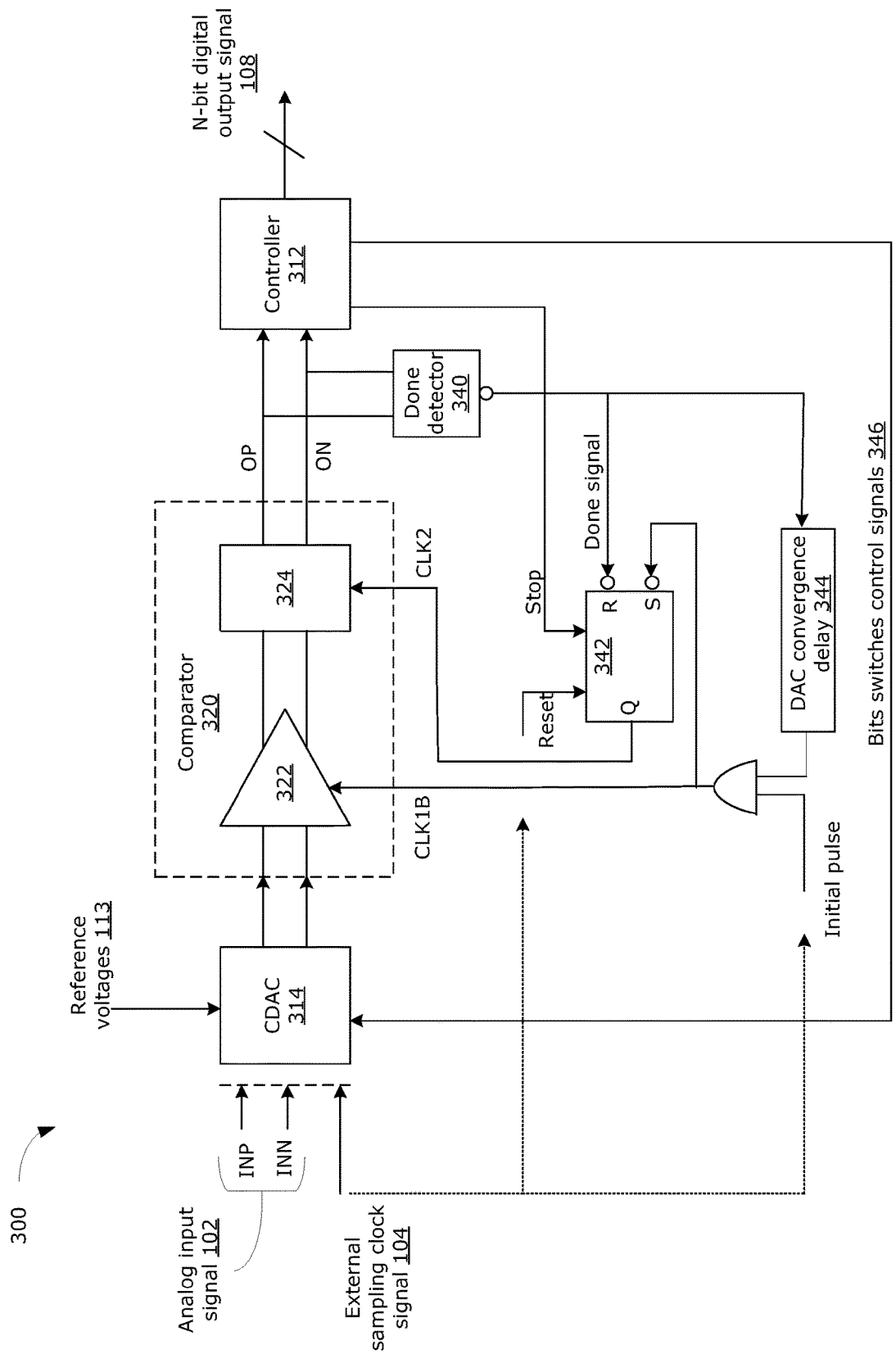
FIG. 6 is a schematic diagram of an example circuit for an asynchronous SAR ADC, using a two-stage comparator with separate resets, in accordance with the present disclosure.

FIGS. 5 and 6 illustrate an example of the disclosed SAR ADC circuit 300, and will be described together. FIG. 5 shows the circuit of an example two-stage comparator 320 with separate resets, which may be used to implement the disclosed SAR ADC circuit of FIG. 6. For simplicity, some details of the disclosed SAR ADC have been omitted, such as the track and hold circuit.

The disclosed two-stage comparator 320 includes a pre-amplifier first stage 322 and a latch second stage 324. Offset compensation (not shown) may be included in the circuit. Compared to the conventional two-stage comparator 220 of FIG. 3, the disclosed two-stage comparator 320 includes a pair of bypass switches 328 in the second stage 324. The additional pair of bypass switches 328 enable the second stage 324 to be decoupled from the first stage 322 after the second stage 324 has received the amplified output from the first stage 322 and the first stage 322 has entered the reset phase (i.e., when the first clock signal CLK1B is high). This enables the first stage 322 to be reset separately from the second stage 324. A small delay buffer 332 may be optionally added, as shown in FIG. 5, to help ensure better handover between the first stage 322 and the second stage 324, as discussed further below.

In the disclosed SAR ADC 300, the two-stage comparator 320 receives, from a DAC (e.g., CDAC 314) an analog signal that is based on the digital bit value stored in a register (e.g., implemented using bit latches) located in a controller 312. The comparator 320 compares the analog input signal 102 with the analog DAC signal, and generates a comparator output. The comparator output is a comparison decision indicating whether the value of the next bit is high or low (i.e., "1" or "0" binary value). The controller 312 stores the next bit value accordingly, and updates the bit value to the CDAC 314 for the next sub-cycle. After all N bits have been processed, the N bit values stored in the controller 312 are outputted as the N-bit digital output signal 108 converted from the analog input signal 102.

The disclosed SAR ADC 300 implements separate resets for the two stages 322, 324 of the comparator 320, unlike the conventional SAR ADC 200 discussed above. An active low pulse of a first clock signal CLK1B is used to activate the first stage 322, and an active high pulse of a second clock signal CLK2 is used to activate the second stage 324. Specifically, the leading edge (i.e., falling edge) of the active pulse of the first clock signal CLK1B causes the first stage 322 to enter the active phase, and the trailing edge (i.e., rising edge) of the active pulse of the first clock signal CLK1B causes the first stage 322 to enter the reset phase. The leading edge (i.e., rising edge) of the active pulse of the second clock signal CLK2 causes the second stage to enter the active phase, and the trailing edge (i.e., falling edge) of the active pulse of the second clock signal CLK2 causes the second stage 324 to enter the reset phase. As will be discussed below, the disclosed SAR ADC 300 provides independent control of the respective active pulses of the first and second clock signals.

In the disclosed SAR ADC 300, the active low pulse width of the first clock signal CLK1B is set independently of the active high pulse width of the second stage clock signal CLK2. In particular, the trailing edges (also referred to as the second edge or back edge) of the active pulses of the two clock signals are separately controlled. The leading edge (also referred to as the first edge or the front edge) of the active low pulse of the first clock signal CLK1B drives the leading edge of the active high pulse of the second clock signal CLK2, through the set input of the RS latch 342. However, the trailing edge of the active pulse of the second clock signal CLK2 is independent from the trailing edge of the active pulse of the first clock signal CLK1B. The trailing edge of the active pulse of the second clock signal CLK2 is driven directly by the RS latch 342 output Q and is dependent on the Done signal outputted from the done detector 340. The trailing edge of the active pulse of the first clock signal CLK1B is driven by the trailing edge of the Done signal. The Done signal has a pulse width from the time when the Done signal is set low (to indicate completion of a bit conversion sub-cycle) until the time when the Done signal returns to high. The timing of the trailing edge of the Done signal is due to inherent time delay in the second stage 324 entering the reset phase and the time delay in the circuitry of the done detector 340. The trailing edge of the active pulse of the first clock signal CLK1B thus occurs earlier than the trailing edge of the active pulse of the second clock signal CLK2.

Thus, the reset phase of the first clock signal CLK1B for the first stage 322 is separated from the reset phase of the second clock signal CLK2 for the second stage 324.

After the second stage 324 has completed the latch, the comparison decision is complete for the sub-cycle. The done detector 340 detects when the comparison decision has been completed and generates the Done signal. Simultaneously, the controller 312 stores the latched bit digital value and sets CDAC switches control signals 346 to process the next bit. The active low Done signal is received through the R input of the RS latch 342, and switches the output Q (which is used as the second clock signal CLK2) to low, thus ending the active phase of the second stage 324 and moving the second stage 324 into the reset phase (thus finishing one bit conversion sub-cycle). When the second stage 324 enters the reset phase (after some inherent time delay), the Done signal is set high (after some inherent time delay in the done detector 340), thus the trailing edge of the active low pulse of the Done signal is created (i.e., the active low pulse of the Done signal is finished). After some delay produced by the DAC convergence delay 344, synchronized to the end of the CDAC conversion to the latest analog value, the active low pulse of the Done signal initiates next bit conversion sub-cycle by setting the first clock CLK1B to active low. At the same time, (with a small delay from the RS latch 342) the second clock signal CLK2 is set to active high, thus moving the second stage 324 to the active (i.e., latch) phase. The active low pulse width of the first clock signal CLK1B is dependent on the pulse width of the Done signal (which is created due to inherent circuit time delays). The active low pulse width of the first clock signal CLK1B is enough to activate the first stage 322 to output a voltage difference at the inputs of the second stage 324. At the end of this active low pulse, the first stage 322 enters the reset phase. However, because the trailing edge of the active high pulse of the second clock signal CLK2 is controlled separately from the first clock signal CLK1B, the second stage 322 is still operating in the active phase when the first stage 322 enters the reset phase. Since the transistors 330 at the inputs of the second stage 324 are set off together with the reset phase of the first stage 322, in order to ensure second stage 322 operation in the active phase, a pair of bypass transistors 328 is switched on (after a small delay provided by the buffer 332). The active phase of the second stage 324 ends when the latch outputs converge to stable digital values and the done detector 340 outputs the active low Done signal. This repeats for the subsequent conversion sub-cycles for each output bit until the Stop signal is outputted by the controller 312, indicating the end of the N-bits conversion cycle.

It should be noted that the first active low pulse of the first clock signal CLK1B is injected from outside of internal asynchronous loop (from the external sampling clock signal 104) for the first sub-cycle, however subsequently the active low pulse of the first clock signal CLK1B is generated by the delayed active low pulse of the Done signal (which depends on the time taken by the second stage 324 to switch from the active phase to the reset phase, plus time delay inherent in the circuitry of the done detector 340). Thus, no significant additional circuitry is required to create the active low pulse of the first clock signal CLK1B. In this way, the Done signal is reused to activate the first stage 322, instead of requiring creation of a separate dedicated pulse.

In the example shown, a small delay is added by the DAC convergence delay unit 344 for delaying the active low pulse of the first clock signal CLK1B and to help ensure synchronization of the beginning of this active pulse with the end of CDAC convergence. For example, the amount of time delay introduced by the DAC convergence delay unit 344 may be preset based on calibration of the SAR ADC 300. In some examples, if the CDAC 314 is sufficiently fast, the DAC convergence delay unit 344 may be omitted.

As mentioned above, the Done signal is provided to the R input of the RS latch 342. When the Done signal indicates completion of a comparison decision at the comparator 320 (e.g., when the Done signal is set low), this causes the RS latch to generate a Q output that is also low. The Q output of the RS latch 242 is provided directly (without inversion) as the second clock signal CLK2 to transition the second stage 324 to the reset phase. As shown in FIG. 5, the second clock signal CLK2 is provided to the gates of the pair of bypass switches 328 (through the delay buffer 332), such that the bypass switches 328 are turned on (with a small delay) when the second clock signal CLK2 is high (and the second stage 324 is in the active phase). The bypass switches 328 are provided across the inputs of the second stage 324, where the amplified signal from the first stage 322 is received. Thus, when the bypass switches 328 are turned on, the signal from the first stage 322 to the second stage 324 is bypassed. This enables the second stage 324 to be decoupled from the first stage 322 when the second stage 324 is activated, but only after the amplified signal has been received from the first stage 322 (thus preserving signal handover between the stages 322, 324).

The Done signal (with optional time delay applied by optional DAC convergence delay unit 344) is provided to the S input of the RS latch 342. The RS latch 342 receives an external reset signal (e.g., from the external sampling clock 104) to reset at the start of each conversion cycle. The RS latch 342 is also connected to the controller 312. The controller 312 counts the bits sub-cycles, stores the digital bit values in its register (not shown), provides CDAC input bit switches control signals and sends a Stop signal to the RS latch 342 when the number of counted sub-cycles reaches the expected N number of bits. Thus, the Stop signal indicates the end of the current conversion cycle and stops all internal asynchronous clocks until the next conversion cycle (triggered by the external sampling clock signal 104).

It may be noted that the RS latch 342 has a delay similar to that of the inverter used to provide the second clock signal CLK2 in the conventional two-stage comparator 220. Thus, the activation speed of the stages 322, 324 may be comparable to the conventional two-stage comparator 220. However, only the second clock signal CLK2 is provided via the RS latch 342. The reset (and hence activation) of the first stage 322 does not need to wait for reset of the second stage 324 and can take place earlier.

Figure 7:
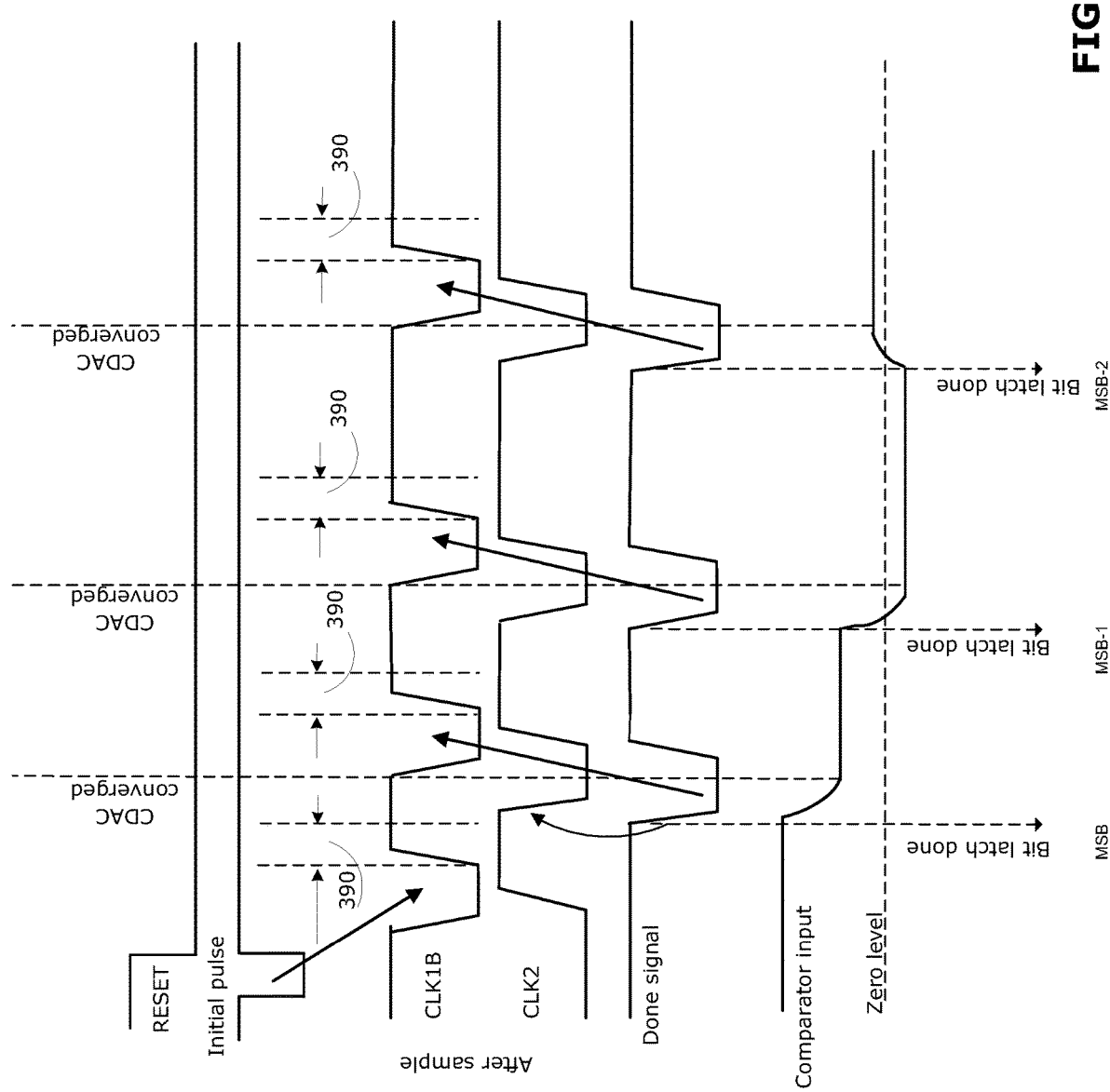
FIG. 7 is an example timing diagram illustrating improved timing of the example disclosed asynchronous SAR ADC of FIG. 6.

FIG. 7 is a timing diagram illustrating the improved conversion speed of the disclosed SAR ADC 300 (similar to FIG. 4, the timing diagram illustrates the timing for conversion of only the first three bits, starting from the MSB).

The conversion cycle begins with a RESET signal (e.g., from the external sampling clock signal 104). The external sampling clock signal 104 is also used to generate the initial pulse that is used for the first pulse of the first clock signal CLK1B. The first stage 322 performs amplification of the signal, after which the first stage 322 can be reset (as indicated by the first clock signal CLK1B being set high again). Meanwhile, the second stage 324 continues to operate until the latch is set (indicated in FIG. 7 as the bit latch Done time). The done detector 340 detects completion of the comparison decision and generates the Done signal (set low to indicate a completed decision). The done detector 340 may be implemented using any suitable circuitry. The Done signal drives (via the RS latch 342) the second clock signal CLK2 to low, as indicated by the curved arrow bringing the second stage to reset state. The Done signal returns to high after an inherent delay time (the time delay of the second stage and done detector circuit 340). The active low pulse of the Done signal is reused as the active low pulse of the first clock signal CLK1B (after some delay from the DAC convergence delay unit 344) in the next bit conversion sub-cycle. The end of the active pulse of the first clock CLK1B signal transitions the first stage 322 into the reset phase independently of the second stage 324, which is still remaining in the active phase.

As the Done signal enters the active low state, the most recent bit value from the comparator 320 is fed to the CDAC 314 (through the bits switches control signals 346 from the controller 312) and the CDAC 314 takes a certain amount of time to converge to a settled value (the end of this process is indicated in FIG. 7 as the CDAC converged vertical line). As can be seen in FIG. 7, the first stage 322 enters the reset phase (when the first clock signal CLK1B goes high) ahead of the CDAC converged time, thus the first stage 322 is ready to process the next bit immediately after the CDAC has sufficiently converged. As previously mentioned, a DAC convergence delay unit 344 may be introduced in the SAR ADC 300 to ensure that the first stage 322 enters the active phase synchronously with the end of the CDAC convergence, so that the first stage 322 can process the CDAC output signal as soon as the CDAC output is ready.

It may be noted that the time required by the first stage 322 to perform amplification is substantially the same for each sub-cycle, however the time required by the second stage 324 to perform the latch can be different for each sub-cycle (depending on the difference between the two signals to be compared for each bit sub-cycle). Because the first stage 322 can be reset without having to wait for the second stage 324, the first stage 322 can enter the reset phase earlier compared to the conventional timing, as indicated by the time saving 390 shown in FIG. 7 for each sub-cycle. Reset of the first stage 322 is not reliant on completion of the second stage 324, while reactivation of the first stage 322 depends on the end of second stage 324 conversion (as indicated by the Done signal).

It may be noted that, because reset of the first stage 322 is triggered earlier compared to conventional SAR ADC circuits, the first stage 322 has more time left to fully reset before the first stage 322 needs to be active again. Accordingly, a smaller reset device, which drives a slower reset compared to a larger reset device, can be used to reset the first stage 322. This may result in power savings compared to conventional SAR ADC circuits.

In some examples, the disclosed SAR ADC may be used for interleaved sub-channel conversion. For example, multiple instances of the disclosed SAR ADC may be used together in parallel, each SAR ADC performing conversion of N-bits per respective sub-channel.

Figure 8:
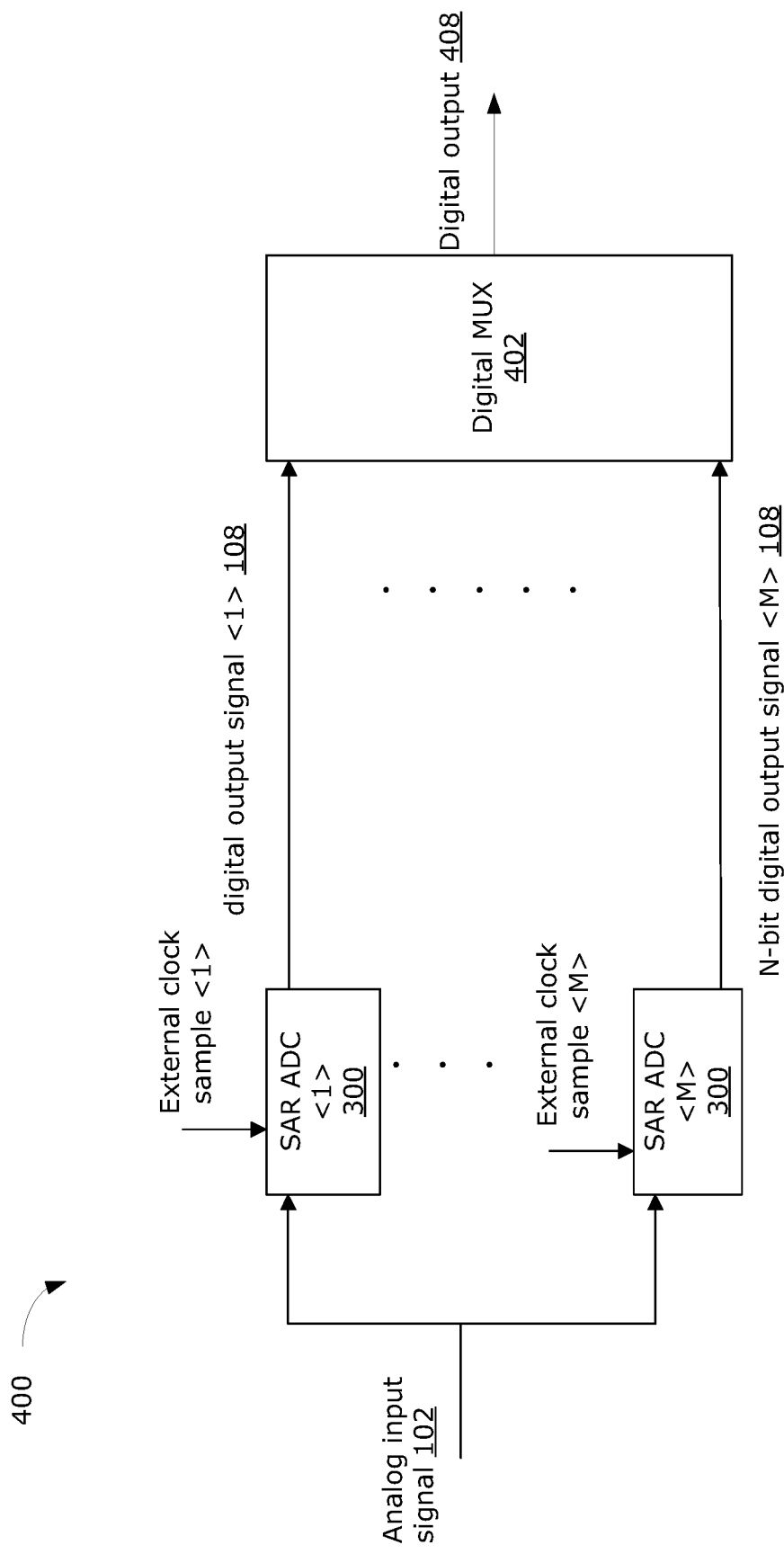
FIG. 8 is a simplified block diagram illustrating an example implementation of the disclosed asynchronous SAR ADC in interleaved sub-channels.

FIG. 8 is a simplified block diagram illustrating an example system 400 using the disclosed SAR ADC for interleaved sub-channel conversion.

In the example system 400, there are M sub-channel instances of the disclosed SAR ADC 300 (denoted from <1> to <M>), each controlled by a respective external clock sample <1> to <M>. Each individual SAR ADC 300 performs conversion for a respective sub-channel, as described above. Each SAR ADC 300 operates independently and in parallel with each other. Each SAR ADC 300 receives the analog input signal 102 and generates a respective N-bit digital signal 108 (denoted from <1> to <M>) for the respective sub-channel. A digital multiplexer (MUX) 402 receives the digital output signals 108 from the M sub-channels, and performs appropriate multiplexing of the output digital signals 108 from the sub-channels to generate a final digital output 408.

By using the disclosed SAR ADC 300 for each sub-channel, the conversion speed of each sub-channel is increased and hence the number of sub-channels required to achieve a target overall conversion speed is reduced. This helps to reduce the total power consumption and occupied chip area of the receiver system. For example, simulations have found that, for a 7-bit conversion per sub-channel, the disclosed SAR ADC provides time savings of about 125 ps out of a total conversion cycle of about 900 ps, which may be translated into about 125 mV supply reduction and/or reduction of interleaved sub-channels from 64 to 56 sub-channels (approximately 15% savings in chip area).

The disclosed asynchronous SAR ADC circuit, using the two-stage comparator with separate reset, enables improved conversion speed with relatively small additions to the circuit. Bypass switches are added to the second stage to enable the second stage to be decoupled from the first stage, thus allowing the first stage to be reset ahead of resetting of the second stage. The Done signal active pulse is reused to activate the first stage of the two-stage comparator, rather than requiring additional hardware to generate a new signal. Accordingly, the disclosed SAR ADC enables improved performance without increase to power consumption. Further, the disclosed SAR ADC is implemented using a single two-stage comparator, thus foregoing the need for extra offset calibration and the need for greater chip area, unlike some other known solutions.

The present disclosure may be applicable for electrical circuits as well as optical processing electrical circuits. The examples disclosed herein may be implemented in any suitable system, including any suitable network system, storage system, computing system, mobile system, datacenter, switches or routers, including SERDES communication systems.

Although the present disclosure has been illustrated by way of circuits having specific circuit components, it should be understood that these are only illustrative and not intended to be limiting. One skilled in the art may implement the present disclosure using suitable variations.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. An asynchronous successive approximation register (SAR) analog-to-digital converter (ADC), comprising:
a register storing bit values of a digital output signal converted from an analog input signal;
a digital to analog converter (DAC) receiving a signal representing a bit value stored in the register, and generating an analog DAC signal based on the bit value;
a two-stage comparator receiving the analog DAC signal and the analog input signal, and generating a comparator output signal representing a comparison decision between the analog DAC signal and the analog input signal, the comparison decision indicating a value of a next bit to be stored in the register, the two-stage comparator having a preamplifier first stage activated by an active pulse of a first clock signal and a latch second stage activated by an active pulse of a second clock signal;
a done detector detecting the comparator output signal, and generating a Done signal indicating completion of the comparison decision;
wherein the Done signal from the done detector is fed back as the active pulse of the first clock signal;
wherein a leading edge of the active pulse of the second clock signal is driven by a leading edge of the active pulse of the first clock signal via an RS latch; and
wherein the Done signal from the done detector is further fed back through the RS latch to drive a trailing edge of the active pulse of the second clock signal.

2. The asynchronous SAR ADC of claim 1, wherein a trailing edge of the active pulse of the first clock signal causes the preamplifier first stage to enter a reset phase prior to completion of the comparison decision, and wherein the leading edge of the active pulse of the first clock signal causes the amplifier first stage to enter an active phase when the Done signal indicates completion of the comparison decision.

3. The asynchronous SAR ADC of claim 2, wherein the trailing edge of the active pulse of the second clock signal causes the latch second stage to enter a reset phase when the Done signal indicates completion of the comparison decision.

4. The asynchronous SAR ADC of claim 2, wherein the analog DAC signal converges to a settled value after a DAC convergence time, and wherein the first clock signal is synchronized with the DAC convergence time to cause the preamplifier first stage to enter the active phase when the analog DAC signal has converged to the settled value.

5. The asynchronous SAR ADC of claim 4, further comprising a DAC convergence delay unit in a feedback path from the done detector to the preamplifier first stage, the DAC convergence delay unit applying a preset time delay to synchronize the first clock signal with the DAC convergence time.

6. The asynchronous SAR ADC of claim 1, wherein the latch second stage includes two bypass switches controlled by the second clock signal, wherein the second clock signal controls the two bypass switches to selectively decouple the latch second stage from the preamplifier first stage.

7. The asynchronous SAR ADC of claim 6, wherein the first clock signal causes the preamplifier first stage to enter a reset phase prior to completion of the comparison decision, and wherein the second clock signal controls the two bypass switches to decouple the latch second stage from the preamplifier first stage when the preamplifier first stage enters the reset phase.

8. The asynchronous SAR ADC of claim 1, wherein the active pulse of the first clock signal has an active pulse width resulting from internal circuit delay of activation of the done detector.

9. A system for conversion of an analog input signal to a digital output signal, the system comprising:
two or more asynchronous successive approximation register (SAR) analog-to-digital converters (ADCs), each asynchronous SAR ADC receiving the analog input signal and performing analog to digital conversion to output a respective sub-channel digital output signal; and
a digital multiplexer receiving the respective sub-channel digital output signals from each respective SAR ADC, and multiplexing the respective sub-channel digital output signals to generate a final digital output signal;
wherein each asynchronous SAR ADC comprises:
a register storing bit values of the respective sub-channel digital output signal converted from the analog input signal;
a digital to analog converter (DAC) receiving a signal representing a bit value stored in the register, and generating an analog DAC signal based on the bit value;
a two-stage comparator receiving the analog DAC signal and the analog input signal, and generating a comparator output signal representing a comparison decision between the analog DAC signal and the analog input signal, the comparison decision indicating a value of a next bit to be stored in the register, the two-stage comparator having a preamplifier first stage activated by an active pulse of a first clock signal and a latch second stage activated by an active pulse of a second clock signal;
a done detector detecting the comparator output signal, and generating a Done signal indicating completion of the comparison decision;

wherein the Done signal from the done detector is fed back as the active pulse of the first clock signal;

wherein a leading edge of the active pulse of the second clock signal is driven by a leading edge of the active pulse of the first clock signal via an RS latch; and wherein the Done signal from the done detector is further fed back through the RS latch to drive a trailing edge of the active pulse of the second clock signal.

10. The system of claim 9, wherein in each asynchronous SAR ADC, a trailing edge of the active pulse of the first clock signal causes the preamplifier first stage to enter a reset phase prior to completion of the comparison decision, and wherein the leading edge of the active pulse of the first clock signal causes the preamplifier first stage to enter an active phase when the Done signal indicates completion of the comparison decision.

11. The system of claim 10, wherein in each asynchronous SAR ADC, the trailing edge of the active pulse of the second clock signal causes the latch second stage to enter a reset phase when the Done signal indicates completion of the comparison decision.

12. The system of claim 10, wherein in each asynchronous SAR ADC, the analog DAC signal converges to a settled value after a DAC convergence time, and wherein the first clock signal is synchronized with the DAC convergence time to cause the preamplifier first stage to enter the active phase when the analog DAC signal has converged to the settled value.

13. The system of claim 12, wherein each asynchronous SAR ADC further comprises a DAC convergence delay unit in a feedback path from the done detector to the preamplifier first stage, the DAC convergence delay unit applying a preset time delay to synchronize the first clock signal with the DAC convergence time.

14. The system of claim 9, wherein in each asynchronous SAR ADC, the latch second stage includes two bypass switches controlled by the second clock signal, wherein the second clock signal controls the two bypass switches to selectively decouple the latch second stage from the preamplifier first stage.

15. The system of claim 14, wherein in each asynchronous SAR ADC, the first clock signal causes the preamplifier first stage to enter a reset phase prior to completion of the comparison decision, and wherein the second clock signal controls the two bypass switches to decouple the latch second stage from the preamplifier first stage when the preamplifier first stage enters the reset phase.

16. The system of claim 9, wherein in each asynchronous SAR ADC, the active pulse of the first clock signal has an active pulse width resulting from internal circuit delay of activation of the done detector.

* * * * *